(12) United States Patent
Kato

(10) Patent No.: US 6,728,903 B1
(45) Date of Patent: Apr. 27, 2004

(54) ELECTRIC PART TEST SYSTEM

(75) Inventor: Yoshiaki Kato, Nerima-ku (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/408,184

(22) Filed: Sep. 29, 1999

(30) Foreign Application Priority Data

Sep. 30, 1998 (JP) ........................................ H10-277151

(51) Int. Cl.$^7$ ................................................. H02H 3/05
(52) U.S. Cl. ........................... 714/31; 714/23; 703/3; 709/216
(58) Field of Search ............................. 714/31, 45, 23, 714/13, 724, 731, 27, 1, 2; 703/3; 712/29; 709/216

(56) References Cited

U.S. PATENT DOCUMENTS

| | | | |
|---|---|---|---|
| 4,567,560 A | * 1/1986 | Polis et al. .................. | 187/248 |
| 4,604,746 A | * 8/1986 | Blum .......................... | 714/32 |
| 5,265,201 A | * 11/1993 | Cabot et al. ................ | 345/504 |
| 5,530,946 A | * 6/1996 | Bouvier et al. .............. | 714/13 |
| 6,023,561 A | * 2/2000 | Mann .......................... | 714/45 |

FOREIGN PATENT DOCUMENTS

DE    41 07 450 A1    9/1992

OTHER PUBLICATIONS

Patent Abstracts of Japan, Publication No. 07063827 A; Publication Date: Mar. 10, 1995, 1 page.

German Official Action, dates Jul. 9, 2001, 4 pages.

* cited by examiner

*Primary Examiner*—Robert Beausoleil
*Assistant Examiner*—Rita A Ziemer
(74) *Attorney, Agent, or Firm*—Rosenthal & Osha L.L.P.

(57) ABSTRACT

A memory test system of the present invention comprises a plurality of memory test units 90A, 90B, . . . , which test memory devices 52 to 56, a host computer (EWS) 10 which evaluates test results of the memory devices 52 to 56, and a common memory unit 12 which connects a plurality of the memory test units 90A, 90B, . . . , to the host computer (EWS) 10. The common memory unit has an interrupt controller (INT CNT) 22. In each of the memory test units 90, a slave processor (MCPU) 40 and a memory for the slave processor (MEM) 14 are provided. MCPU 40 reads memory test results and responses of local processors (RCPU) 42 to 46 which are stored in RMEMs 32 and transfers read data to SMEM 16. MCPU 40 generates an interrupt signal. When all MCPUs 40 generate interrupt signals, INT CNT 22 generates an interrupt signal INT to the EWS 10. The EWS 10 may perform several functions based on the interrupt signal INT.

13 Claims, 9 Drawing Sheets

ELECTRIC PART TEST SYSTEM

This patent application claims priority based on a Japanese patent application, H10-277151 filed on Sep. 30, 1998, the contents of which are incorporated herein by reference.

BACKGROUND OF THE INVENTION

1. Field of the Invention

The present invention relates to an electric part test system that tests a plurality of electric parts in parallel, and more particularly, to an electric component test system which tests a plurality of semiconductor memories in parallel.

2. Description of the Related Art

In FIG. 1, a conventional memory test system is shown as an example of an electric part test system. This memory test system comprises a plurality of memory test units 90A, 90B, . . . , which test memory devices 52 to 56, a host computer (EWS) 10 which evaluates test results of the memory devices 52 to 56, and a common memory unit 12 which connects a plurality of the memory test units 90A, 90B, . . . , to the host computer (EWS) 10. Each memory test unit 90 has a memory tester 50 which tests a plurality of the memory devices 52 to 56, RMEMs 32 to 36 that receive and store the test results of the memory devices 52 to 56 respectively, RCPUs 42 to 46 that are local processors and write the test results to the corresponding RMEMs 32 to 36 respectively, a VME bus which connects RCPUs 42 to 46, and an VME I/F 80 which connects the VME bus to the common memory unit 12.

The common memory unit 12 has a plurality of common memories (SMEM) 16A, 16B, . . . , that are assigned to the respective memory test units 90, and a host computer interface (EWS I/F) 20 which connects the common memories 16A, 16B, . . . , and the host computer (EWS) 10. RCPUs 42 to 46 write the test results to SMEM 16, which are read from RMEM 32 to 36 respectively. The EWS 10 reads the test results, which are stored in SMEM 16, via the EWS I/F 20.

Any one of RCPUs 42 to 46 may become a bus master of the VME bus and write the test results to SMEM 16 so that a bus arbitration occurs on the VME bus. As a result, the data transfer is delayed for the bus arbitration. When the EWS 10 notifies a command to RCPUs 42 to 46, the EWS 10 must write the command for all RCPUs 42 to 46 to SMEMs 16 respectively which is time consuming. When RCPUs 42 to 46 notify the EWS 10 of responses to the command, they are required to become bus masters in order to write the responses to SMEM 16. This bus arbitration takes long time. Furthermore, even in the case where the responses of RCPUs 42 to 46 to the command provided from the EWS 10 are the same, the EWS 10 has to read each of the responses from SMEMs 16 and is overloaded.

SUMMARY OF THE INVENTION

It is therefore an object of the present invention to provide an electric part test system which overcomes the above issues in the related art. This object is achieved by combinations described in the independent claims. The dependent claims define further advantageous and exemplary combinations of the present invention.

According to the first aspect of the present invention, an electric part test system for testing a plurality of electric parts comprises a host computer which evaluates test results of the electric parts which are tested by the electric part test system; a plurality of slave processors which are controlled by the host computer and notify it of the test results of the electric parts; common memories which the slave processors may write data to and the host computer may read the data from; and a notifying unit for notifying the host computer in a case where all of the processors generate interrupt signals.

A plurality of continuous memory spaces in the common memories may be assigned to the respective slave processors. The electric part test system may further comprise local processors, one of each provided for each of the electric parts in order to receive each of the test results of the electric parts. The slave processors receive the test results from the local processors and write the test results to the common memories. Each of the slave processors receives the test results from the local processors and stores these test results in the common memory.

Each of the slave processors is connected to a respective common bus, to which a plurality of the local processors are connected. The local processors have local memories to which respective memory spaces on the bus are assigned. The memory spaces of a plurality of the local memories are continuous on the bus. When the electric part test system is initialized, each of the local processors has a means for notifying the slave processor of completion of initializing when each of the local processors initializes the local memory. The slave processor generates an interrupt signal when notified of the completion of initializing from all of the local processors that are connected to the slave processor by the bus. The host computer reads status information showing status at the time of completion of initialization when all of the slave processors generate the interrupt signals.

When the host computer sends a command to the local processors, the host computer writes the command to the common memories. The slave processors transfer the command from the common memories to the local processors.

When the local processors provided for each of the slave processors complete predetermined jobs, the slave processor notifies the host computer of the job completion.

The host computer reads the contents of responses based on the predetermined jobs completed by the local processors when all of the slave processors generate the interrupt signals.

The notifying unit has an AND gate, to which the interrupt signals generated by the slave processors are input. The notifying unit then notifies the host computer based on the output of the AND gate.

According to the second aspect of the present invention, a transmission method for transmitting a command in an electric part test system is provided. This electric part test system comprises a host computer which evaluates the test results of electric parts; a plurality of local processors, each of which is provided to each of the electric parts and receives each of the test results of the electric parts; a plurality of slave processors which notify the host computer of the test results received by the local processors; and common memories which the slave processors may write data to and the host computer may read the data from. In this electric part test system, the transmission method comprises a step in which the host computer writes the command to the common memories and a step in which the slave processors transfer the command from the common memories to the local processors.

According to the third aspect of the present invention, a transmission method of transmitting test results of electric parts in an electric part test system is provided. This electric part test system comprises a host computer which evaluates the test results; a plurality of local processors, each of which is provided to each of the electric parts and receives each of the test results of the electric parts; a plurality of slave processors, each of which is connected to the local processors by a common bus; and common memories which the slave processors may write data to and the host computer may read the data from. In this electric part test system, the transmission method comprises a step in which each of the slave processors judges whether the local processors connected to each of the slave processors receive the test results; a step in which the slave processors write the test results received by the local processors to the common memories; a step in which the slave processors generate interrupt signals to the host computer; and a step in which the test results written to the common memories are transmitted to the host computer when all of the slave processors generate interrupt signals.

This summary of the invention does not necessarily describe all necessary features. The invention may also be a sub-combination of these described features.

DETAILED DESCRIPTION OF THE INVENTION

The invention will now be described based on the preferred embodiments. This does not intend to limit the scope of the present invention, but exemplify the invention. All of the features and the combinations thereof described in the embodiment are not necessarily essential to the invention.

Figure 1:
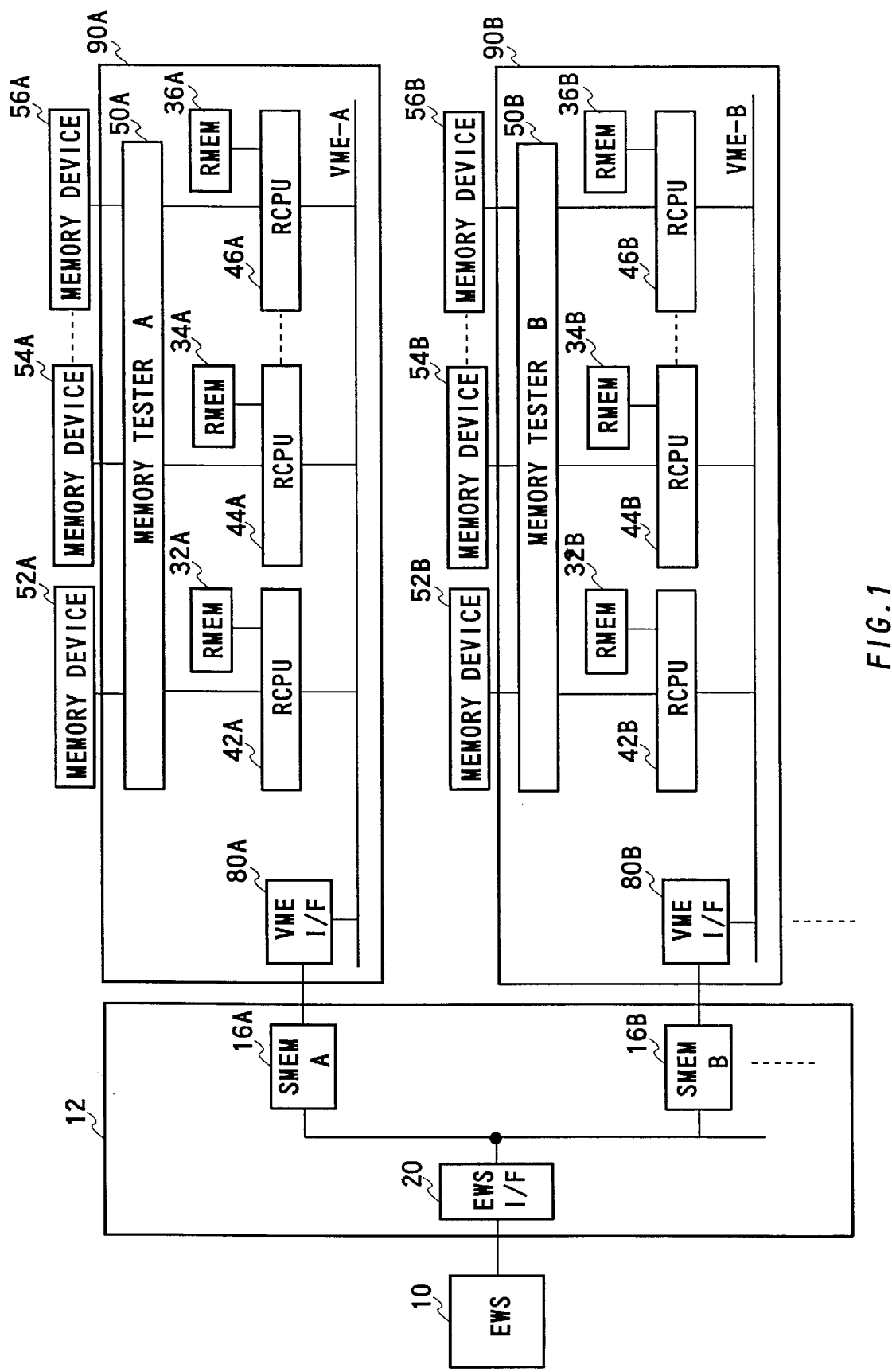
FIG. 1 is a block diagram of a conventional memory test system as an example of an electric part memory system.
Figure 2:
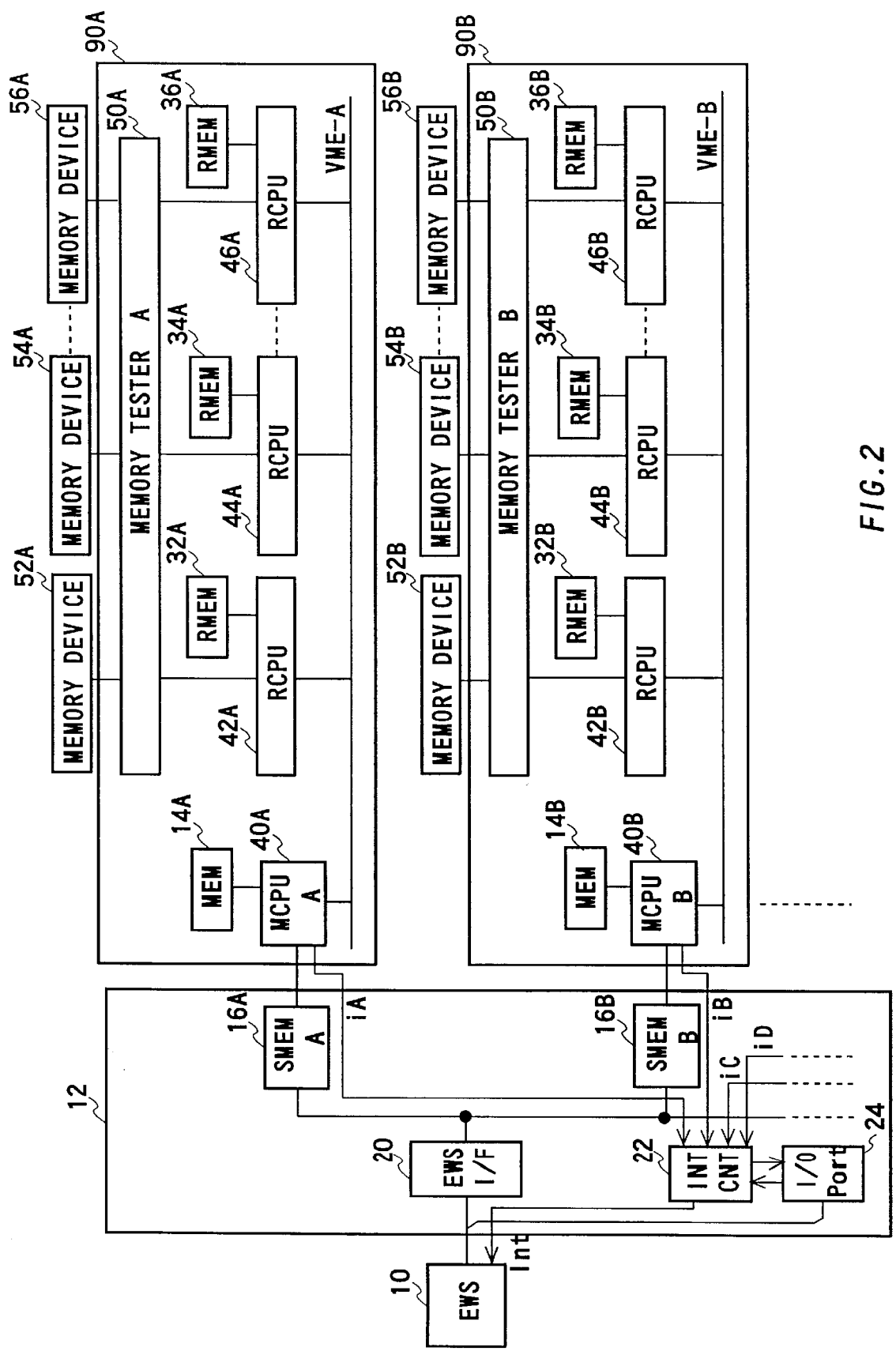
FIG. 2 is a block diagram of a structure of a memory test system of the present invention.

FIG. 2 is a block diagram of a memory test system of the present invention. In FIG. 2, the reference numerals that are same as those used in FIG. 1 refer to the same components therefore, an explanation of these components is omitted. Compared with the structure shown in FIG. 1, the memory test system of the present invention has an interrupt controller (INT CNT) 22 in the common memory unit 12. Additionally, in each of the memory test units 90, a slave processor (MCPU) 40 and a memory for the slave processor (MEM) 14 are provided on behalf of the VME I/F 80 shown in FIG. 1

The MCPU 40 reads memory test results and responses of local processors (RCPU) 42 to 46 which are stored in RMEMs 32. It then transfers read data to SMEM 16 on the VME transfer and store it in SMEM 16. The MCPU 40 also reads commands generated by the EWS 10 and written to SMEM 16, and provides each of RCPUs 42 to 46 with these commands. Necessary data for operating MCPU 40 is stored in the MEM 14. Such data includes for example, the contents of a command which is sent from the EWS 10 to RCPUs 42 to 46, and data which indicates to one or more of the RCPUs 42 to 46 where each command should be transferred.

Figure 3:
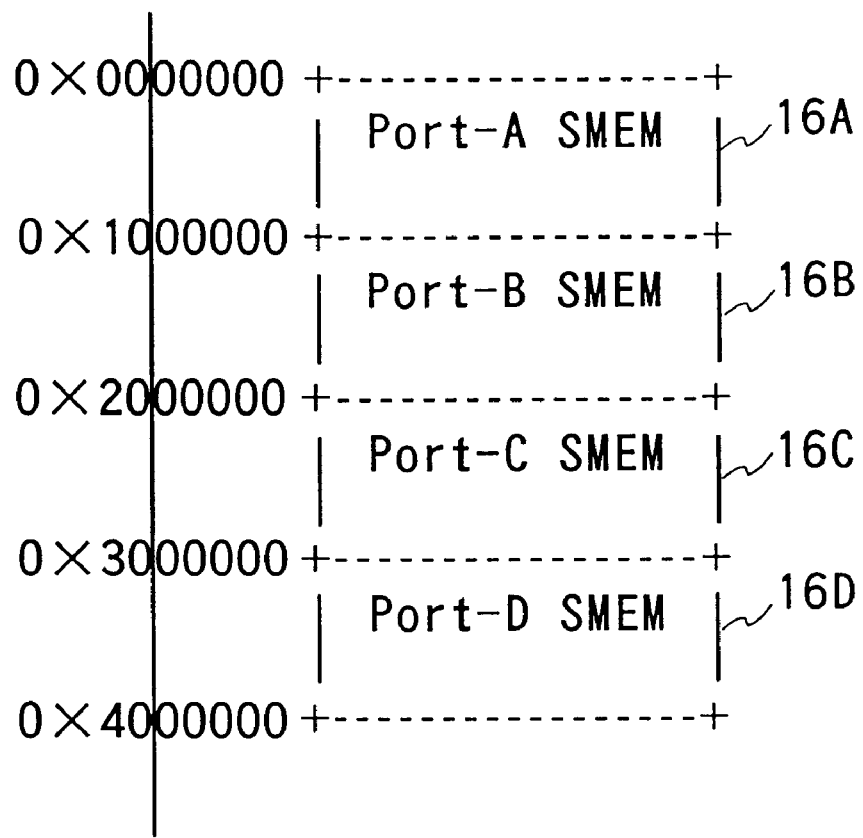
FIG. 3 is a memory map in a common memory unit seen from the EWS.

FIG. 3 is a memory map in the common memory unit 12 seen from the EWS 10. Continuous spaces provided within the common memory unit 12 are assigned to a plurality of the common memories (SMEM) 16. In FIG. 3, it is exemplified that 16 megabyte address space from address 0 to F,FFFFF is assigned to SMEM 16A for the VME bus A and 16 megabyte address space from address 10, 00000 to 1F,FFFFF is assigned to SMEM 16B for the VME bus B. Similarly, 16 megabyte address space is assigned to SMEM 16C for the VME bus C and next 16 megabyte address space is assigned to SMEM 16D for the VME bus D. Although the number of the memory test units is set to 4 (90A to 90D) in the preferred embodiment, the scope of the present invention should not be restricted toonly 4 test units.

Figure 4:
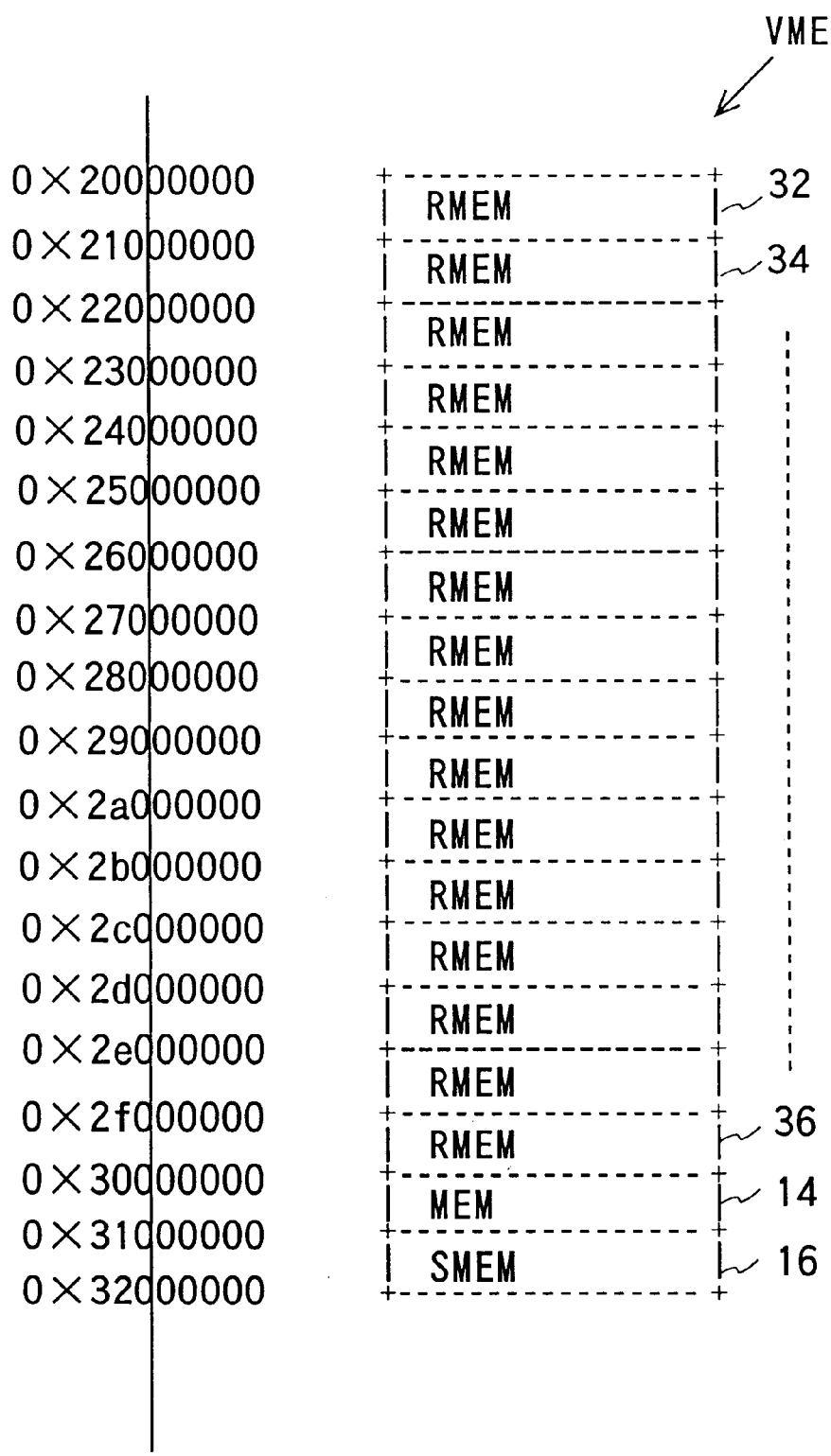
FIG. 4 is a memory map that shows address spaces of RMEM, MEM and SMEM on each VME bus.

FIG. 4 is a memory map that shows address spaces of RMEMs 32 to 36, MEM 14 and SMEM 16 on each VME bus. Continuous memory address spaces are assigned to RMEM 32 to 36, MEM 14 and SMEM 16. In the present embodiment, 16 megabyte address space from address 00,00000 to 0F, FFFFF of the common memory for the Port-A as shown in FIG. 3 is assigned to 16 megabyte address space from address 310,00000 to 31F,FFFFF on the VME bus A as shown in FIG. 4. Similarly, 16 megabyte address space from address 10,00000 to 1F,FFFFF for Port-B as shown in FIG. 3 is assigned to 16 megabyte address space from address 310,00000 to 31F,FFFFF on the VME bus B.

Figure 5:
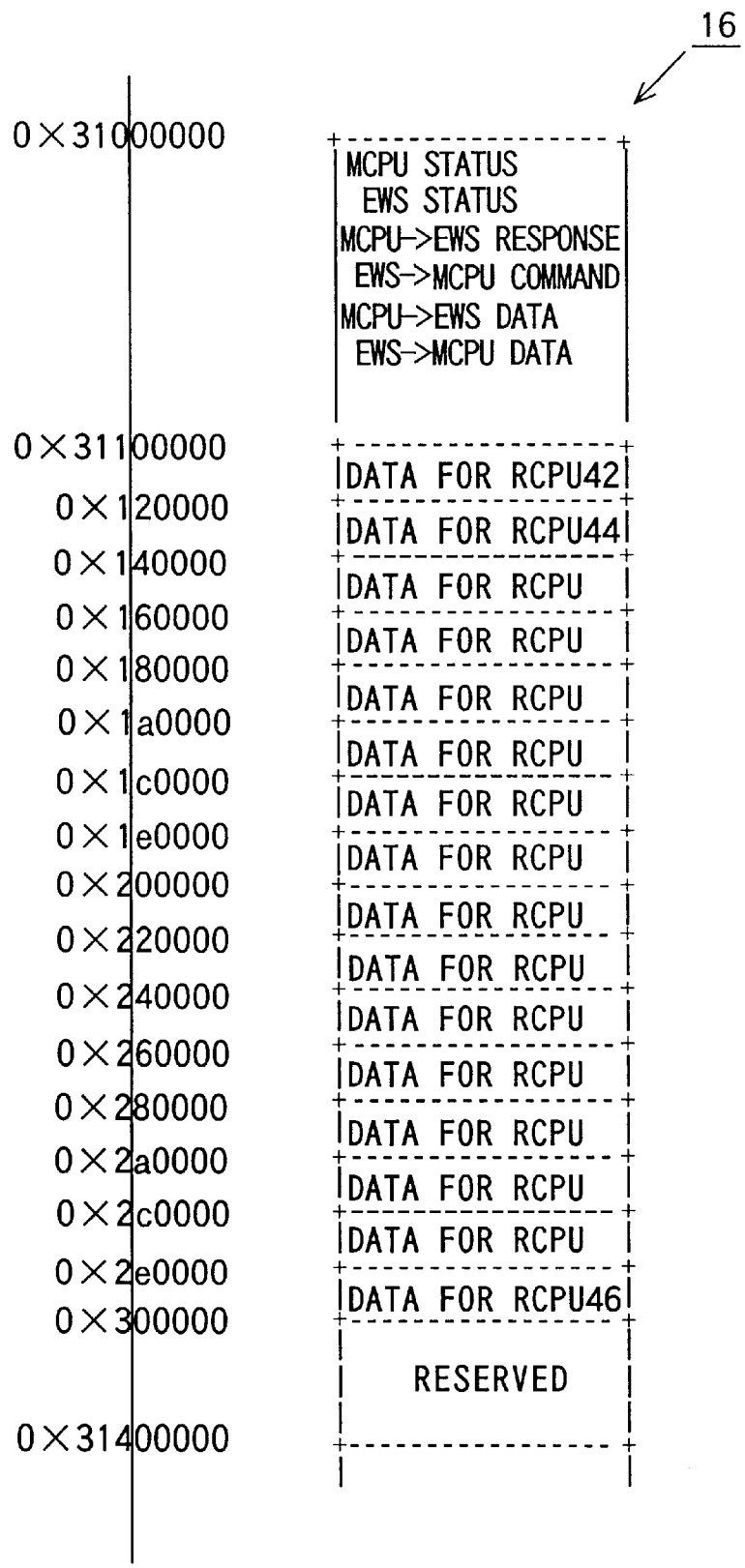
FIG. 5 is a detail memory map that shows a memory space of SMEM.

FIG. 5 is a detail memory map that shows a memory space of SMEM 16 shown in FIG. 4 as seen from the VME side. An address space from addresses 310,00000 to 310,FFFFF is used for communicating between the EWS 10 and MCPU 40. In this communication address space are stored commands from the EWS 10 to MCPU 40, status of MCPU 40 and RCPUs 42 to 46, responses from MCPU 40 to the EWS 10 and data related to commands and/or responses that are necessary to control communication between the EWS 10 and MCPU 40.

Data to be transferred to a plurality of RCPUs 42 to 46 are stored in continuous address spaces. In the present embodiment, data for RCPU 42 is stored in an address space from addresses 311,00000 to 311,1FFFF and data for RCPU 44 is stored in an address space from addresses 311,20000 to 311,3FFFF. Data for RCPUs 42 to 46 are assigned to continuous address spaces so that the EWS 10 may simultaneously and easily transfer this data to SMEM 16. When the EWS 10 has a DMA controller, the EWS 10 can write continuous data to SMEM 16 by using a single simple DMA transfer command. Also, when MCPU 40 has a DMA controller, MCPU 40 can transfer commands for each of the RCPUs 42 to 46 from SMEM 16 to RMEMs 32 to 36 using a single simple DMA transfer command.

Figure 6:
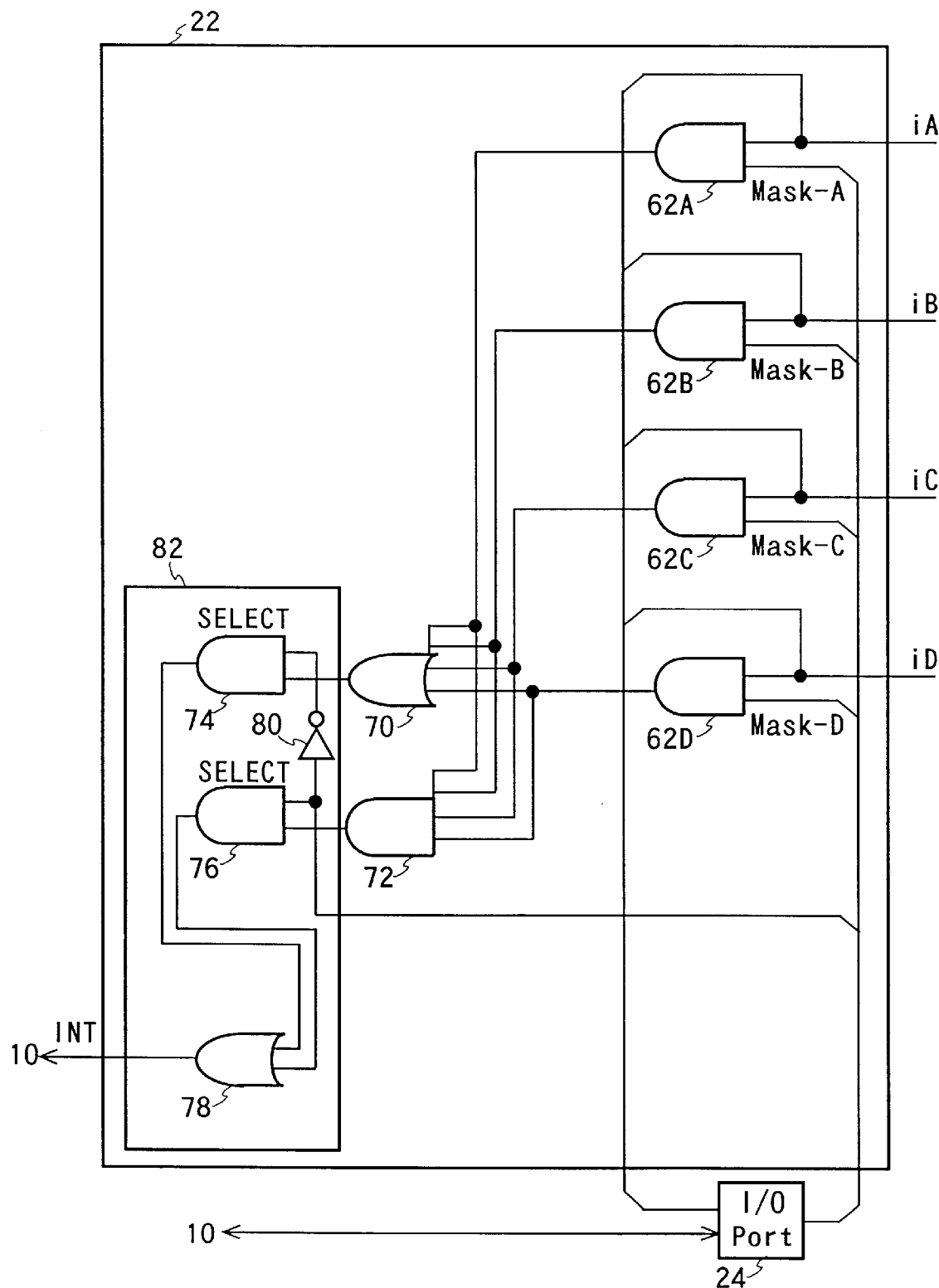
FIG. 6 is a block diagram which shows a detail structure of an interrupt controller (INT CNT) and an I/O Port.

FIG. 6 is a block diagram which shows a detail structure of the interrupt controller (INT CNT) 22 and the I/O Port 24 shown in FIG. 2. INT CNT 22 has AND gates 62A to 62D which mask the respective interrupt signals iA to iD generated by MCPUs 40, and an OR gate 70 which performs the function of logical OR of interrupt signals that pass the AND gates 62A to 62D. INT CNT 22 also has an AND gate 72 which performs the function of logical AND of interrupt signals that pass the AND gates 62A to 62D, and a selection circuit 82 which selects either a signal generated by the OR gate 70 or a signal generated by the AND gate 72.

The I/O Port 24 generates mask signals MASK-A to MASK-D that mask interrupt signals iA to iD output by MCPUs 40 and a select signal SELECT which controls the selection circuit 82. The selection circuit 82 has an AND gate 74 which masks an output signal from the OR gate 70, an AND gate 76 which masks an output signal from the AND gate 72, an OR gate 78 which outputs the logical OR of output signals from AND gate 74 and 76, and an inverter 80 which inverts the selection signal SELECT generated by the I/O Port 24.

MCPUs 40 generate interrupt signals iA to iD respectively when MCPUs 40 notify the EWS 10 of responses or status. Each of the interrupt signals iA to iD generated by MCPUs 40 is input to each of the corresponding AND gates 62A to 62D. As the mask signal output from the I/O Port 24 is input into another input terminal of the AND gates 62A to 62D, it is possible to mask each of the interrupt signals iA to iD by setting the mask signal LAW (0). Furthermore, as the interrupt signals iA to iD are input into the I/O Port 24, the EWS 10 may read the status of the interrupt signals iA to iD via the I/O Port 24. When an interrupt signal INT is notified to the EWS 10, the EWS 10 reads the status of the interrupt signals iA to iD via the I/O Port 24 to allow checking of the status of those signals. The EWS 10 may therefore identify whether MCPUs 40 generated the interrupt signals. When at least one of the interrupt signals iA to iD is generated, an output of the OR gate 70 becomes HIGH (1). When all of the interrupt signals iA to iD are generated, an output of the AND gate 72 becomes HIGH (1). The selection signal SELECT indicates which mode is selected. One mode is OR mode where the EWS 10 is notified that at least one of MCPUs 40A to 40D generated the interrupt signal and another mode is AND mode where the EWS 10 is notified that all of MCPUs 40A to 40D generated interrupt signals.

AND mode is preferably selected when process time between RCPUs 42 to 46 are substantially the same, for example, in a case where many of the same memory devices are tested. In contrast, OR mode is preferably selected when test time between tested electric components are different, for example, in a case where different kinds of memories are tested in parallel. Thus, either AND mode or OR mode is selected in accordance with the electric components which are actually tested. For example, in the case where the selection signal SELECT is HIGH (1), And mode is selected, or alternatively, in the case where the selection signal SELECT is LOW (0), OR mode is selected. The selection signal SELECT is usually 1, only if all MCPUs 40A to 40D generate the interrupt signals iA to iD respectively, an interrupt signal INT is supplied to the EWS 10.

Figure 7:
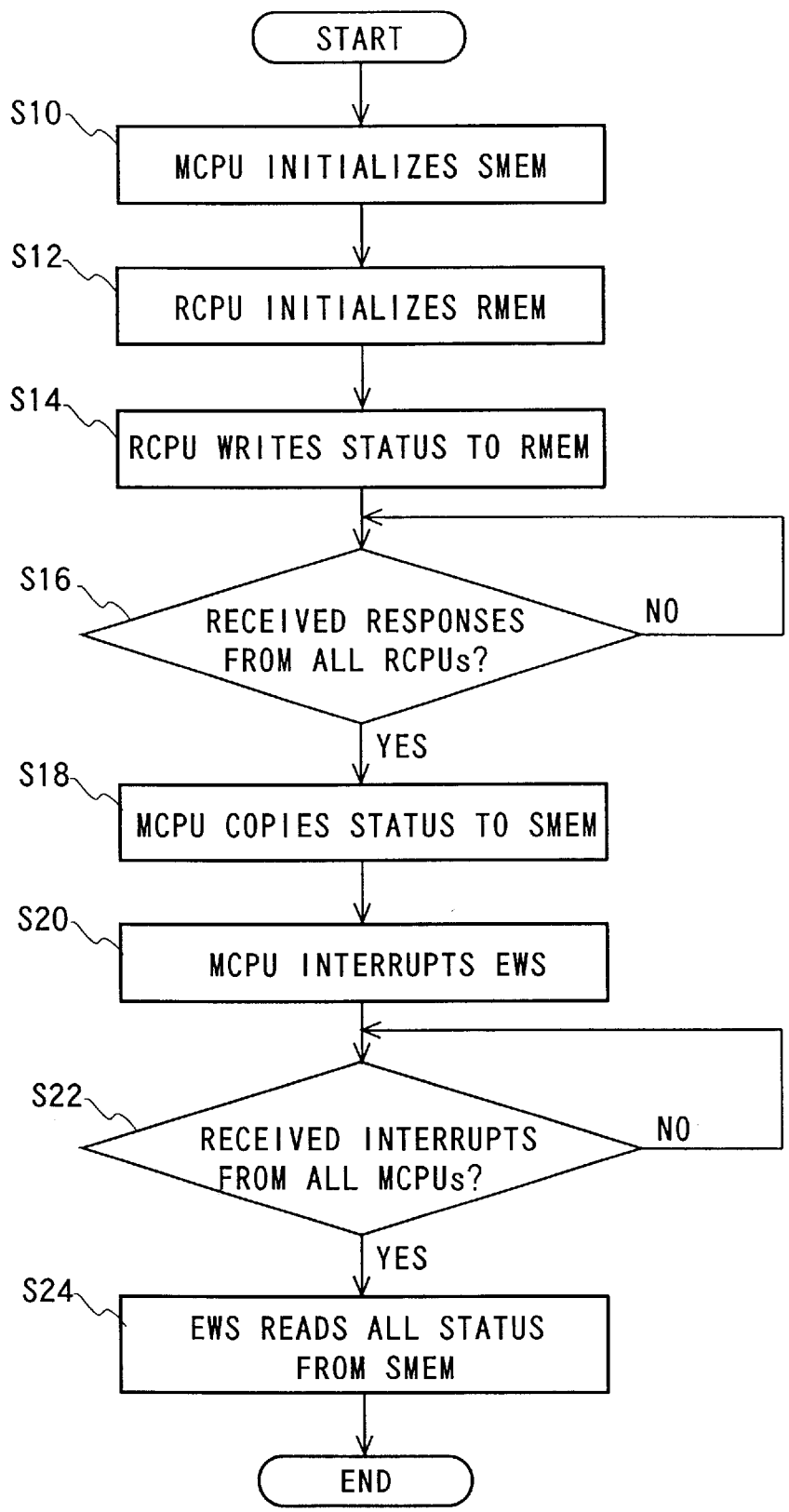
FIG. 7 is a flowchart that shows an initializing process of the memory test system disclosed in the embodiment.

FIG. 7 is a flowchart that shows the initializing process of the memory test system disclosed in the embodiment. First, MCPU 40 initializes SMEM 16 (S10) and each of RCPUs 42 to 46 initializes each of RMEMs 32 to 36 which is set to each RCPU 42 to 46 (S12). When the initializing process of RMEMs 32 to 36 is completed, each of the RCPUs 42 to 46 stores status information, showing the status when the initializing process is completed, in a predetermined area of each of RMEMs 32 to 36 (S14). Each of the RCPUs 42 to 46 notifies MCPU 40 of a response notifying the completion of the initializing process by interrupting.

MCPU 40 judges whether it received interrupt signals from all RCPUs 42 to 46 (S16). When MCPU 40 receives interrupt signals from all RCPUs 42 to 46, MCPU 40 reads the status information stored in RMEMs 32 to 36, copies them to SMEM 16 (S18) and generates an interrupt signal "i" to the EWS 10. The interrupt signal "i" is input to the interrupt controller (INT CNT) 22 in the common memory unit 12.

The steps from S10 to S20 are performed in all memory test units 90 in parallel. INT CNT 22 notifies the EWS 10 of the interrupt signal INT (S22) in a case where the interrupt mode of INT CNT 22 is set to AND mode and when interrupt signals iA to iD are notified from all MCPUs 40A to 40D. When the EWS 10 receives the interrupt signal INT, the EWS 10 simultaneously reads the status information from SMEMs 16A to 16D (S24). Thus, the EWS 10 receives a single interrupt signal INT so that it may read the status information generated by all RCPUs 42 to 46.

In the prior art, each of RCPUs 42 to 46, which is provided in each memory test unit 90, notifies the EWS 10 of an interrupt when the initializing process is completed. Because extreme numbers of interrupt signals are notified to the EWS 10, it takes much time to start and complete the interrupt process. In comparison with the prior art, according to the present invention, the EWS 10 may read and handle the status information generated by each of RCPUs 42 to 46 in a shorter period.

Figure 8:
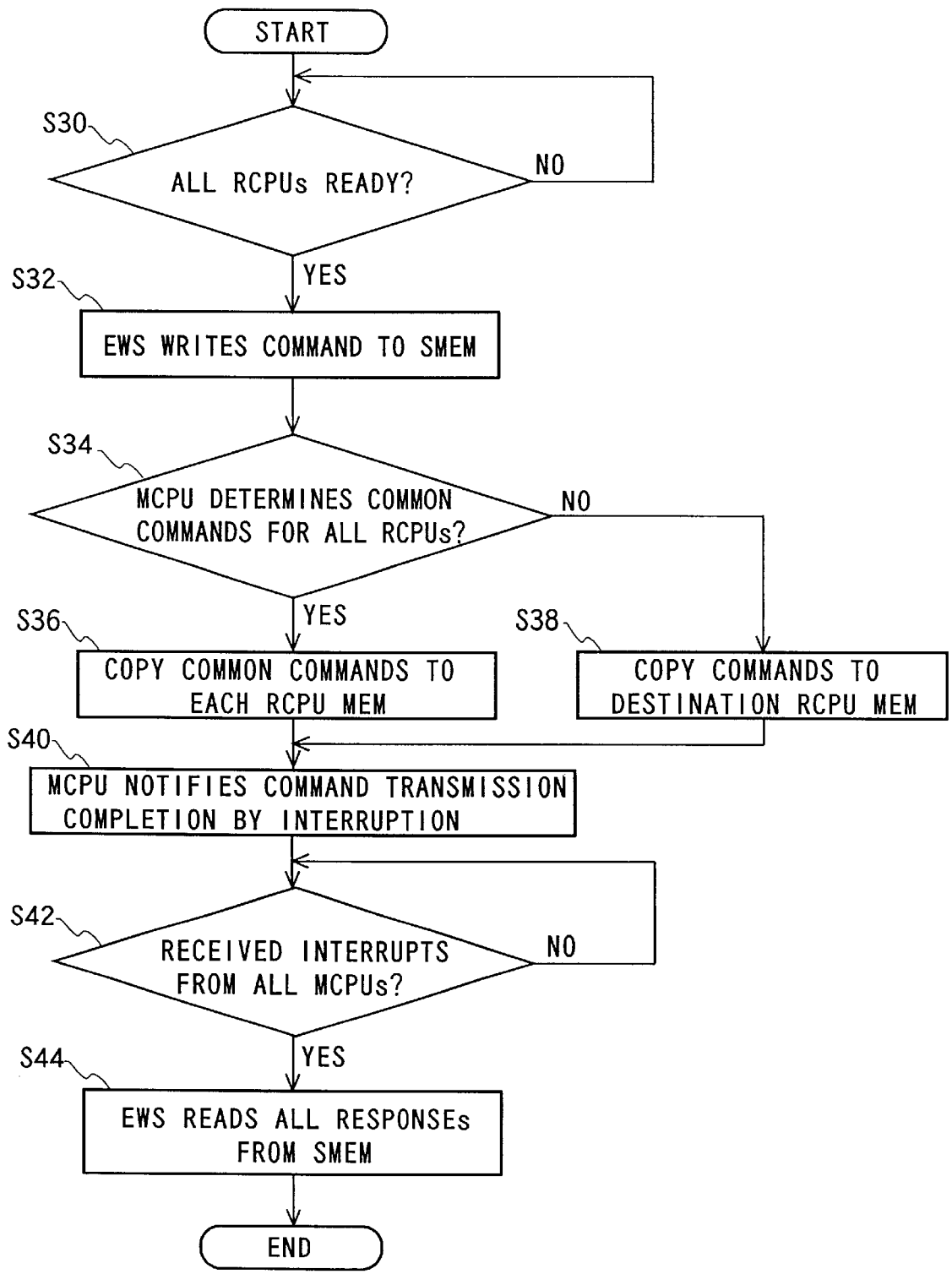
FIG. 8 is a flowchart that shows an operation of the entire memory test system when the EWS sends a command to each of RCPUs.

FIG. 8 is a flowchart that shows an operation of the entire memory test system when the EWS 10 sends a command to each of RCPUs 42 to 46. When the EWS 10 generates the command, firstly, the EWS 10 judges whether all RCPUs 42 to 46 are READY (in a status where they can handle the command) or not (S30). The EWS 10 can judge this by reading the status information stored in SMEM 16. When any of RCPUs 42 to 46 are not READY, the EWS 10 waits. Conversely, when all RCPUs 42 to 46 are READY, the EWS 10 writes the command for RCPUs 42 to 46 to SMEMs 16A to 16D (S32).

Following this, MCPU 40 judges whether or not the command notified from the EWS 10 is a common command for all RCPUs 42 to 46 (S34). If the command is a common command, MCPU 40 copies the command to RMEMs 32 to 36 for RCPUs 42 to 46. In the case that the EWS 10 writes the single common command to SMEMs 16, each MCPU 40 reads the single common command and transfers it to RCPUs 42 to 46. The result is, the load of the EWS 10 can be decreased and the process time of the entire memory test system can be shortened drastically while the command is sent.

In S34, when the command is one directed to each of RCPUs 42 to 46, MCPU 40 copies the command to each of RMEMs 32 to 36 provided to RCPUs 42 to 46 according to the destination of the command (S38). When MCPU 40 completes the transfer of the command to RCPUs 42 to 46, MCPU 40 notifies the EWS 10 of the completion of transferring the command by generating an interrupt signal "i" (S40). The steps from S34 to S40 are performed in all MCPUs 40. The interrupt signals iA to iD generated by MCPUs are received by INT CNT 22. When all interrupt signals iA to iD are effective (1), an interrupt signal INT is notified to the EWS 10 (S42). When the EWS 10 receives the interrupt signal INT, the EWS 10 simultaneously reads all responses from SMEMs 16A to 16D (S44).

In the prior art, many RCPUs 42 to 46, which are provided in each of memory test units 90, notify the EWS 10 directly of interrupt signals which confirm the reception of the command. In comparison with the prior art, in the present embodiment, the single interrupt signal INT is notified to the EWS 10 so that the EWS 10 may confirm that all RCPUs 42 to 46 have received the command. Thus, the load of the EWS 10 maybe decreased and the process period for sending commands may be shortened in the entire memory test system.

Figure 9:
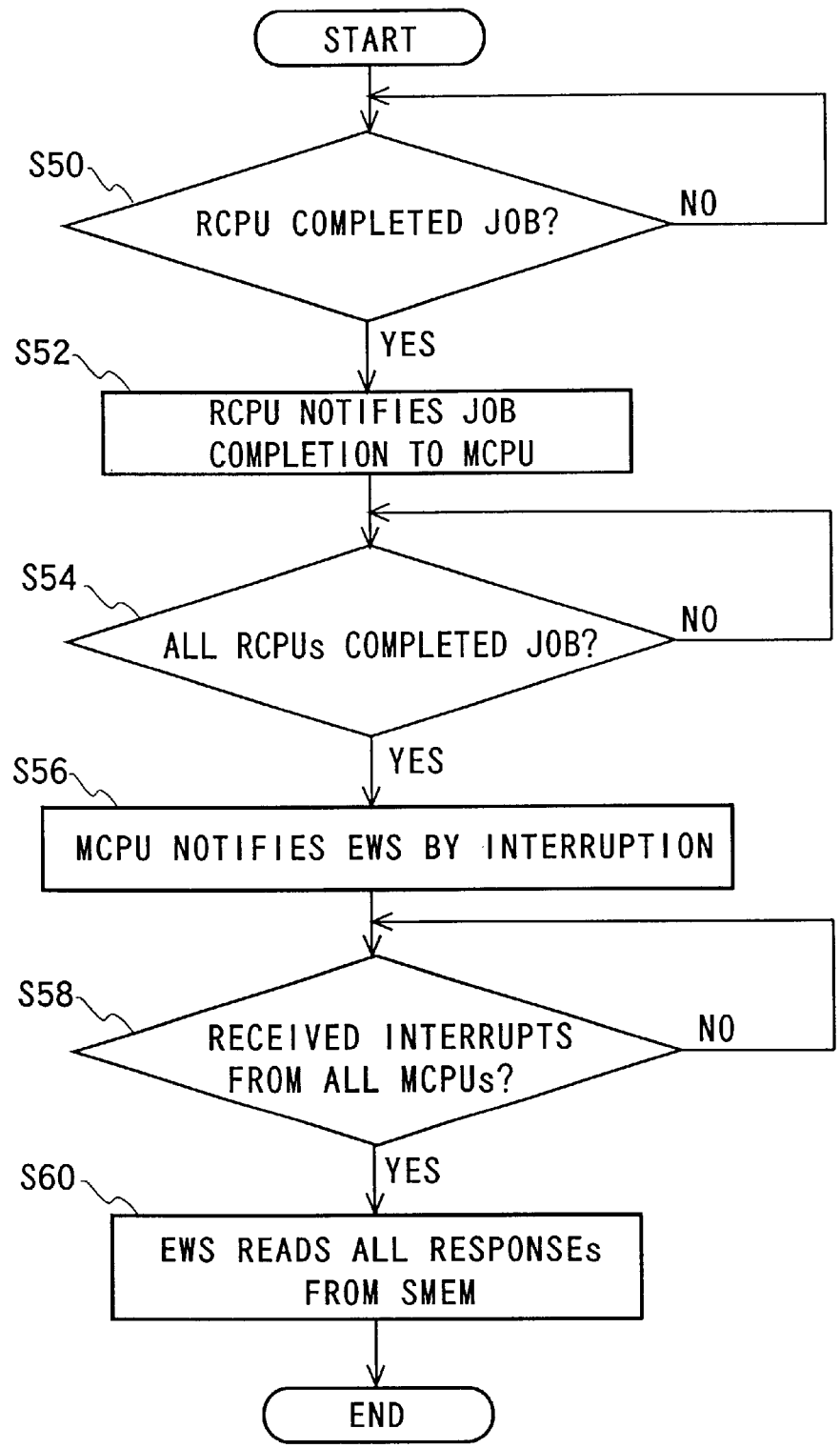
FIG. 9 is a flowchart that shows an operation of the entire memory test system when RCPUs notify the EWS of responses.

FIG. 9 is a flowchart that shows an operation of the entire memory test system when RCPUs 42 to 46 notify the EWS 10 of responses. First, each of RCPUs 42 to 46 judges whether or not the execution of a supplied command is completed, for example, in memory test (S50). When the execution of the supplied command is completed, each of RCPUs 42 to 46 notifies MCPU 40 of the job completion (S52). MCPU 40 judges whether or not all RCPUs 42 to 46 complete the execution of the command (S54). When all RCPUs 42 to 46 complete the execution of the command, MCPU 40 writes contents of responses to the command to SMEM 16 and generates an interrupt signal "i" (S56). Steps S50 to S56 are executed in each memory test unit 90. Interrupt signals iA to iD are input into INT CNT 22. When all interrupt signals iA to iD are HIGH (1), a single interrupt signal INT is notified to the EWS 10 (S58). Following this, the EWS 10 simultaneously reads all responses to the command from SMEMs 16 (S60).

In the prior art, each of RCPUs 42 to 46 directly notifies the EWS 10 of each response that confirms the completion of the command. Many interrupt signals are input into the EWS 10 making it slow to determine the order of interrupt processes, to change tasks, and so on. Moreover, the EWS 10 has to manage RCPUs 42 to 46, in contrast, according to the present embodiment, the EWS 10 may handle all responses generated by RCPUs 42 to 46 by receiving the single interrupt signal INT. Thus, the load of the EWS 10 may be decreased. In addition, the process period for sending commands of the entire memory test system may be shortened so that the speed of the memory test may be increased.

As described above, according to the present embodiment, the EWS 10 may handle the responses of many memory devices 52 to 56 and read the status information by receiving the single interrupt signal INT. Therefore, the frequency of changing the process may be decreased which is advantageous when an interrupt signal is input as it takes a shorter time to perform the memory test. Moreover, the EWS 10 may manage many memory devices 52 to 56 by receiving the single interrupt signal INT so that it becomes easier to make an evaluation program of a memory in the EWS 10. Furthermore, the EWS 10 may generate statistical evaluation data easily based on the test results of many memory devices.

Although the present invention has been described by way of exemplary embodiments, it should be understood that many changes and substitutions may be made by those skilled in the art. This would in no way depart from the spirit and the scope of the present invention which is defined only by the appended claims.

Particularly note that although a memory test system is explained in the above embodiment as an example of an electric part test system, it is needless to say that the present invention may be utilized when semiconductors other than memory are tested or electric parts other than semiconductors are tested.

What is claimed is:

1. An electric part test system which can test a plurality of electric parts, comprising:
   a host computer which evaluates test results of said electric parts which are tested by said electric part test system;
   a plurality of slave processors which are controlled by said host computer and notify said host computer of said test results of said electric parts;
   common memories which said slave processors may write data to and said host computer may read said data from; and
   a notifying unit for notifying said host computer in a case where all of said processors generate interrupt signals.

2. An electric part test system as claimed in claim 1, wherein a plurality of continuous memory spaces in said common memories are assigned to said slave processors respectively.

3. An electric part test system as claimed in claim 1, further comprising:
   local processors, each of which is provided for each of said electric parts and receives each of said test results of said electric parts;
   wherein said slave processors receive said test results from said local processors and write said test results to said common memories.

4. An electric part test system as claimed in claim 3, wherein each of said slave processors receives said test results from said local processors and stores said test results in said common memory.

5. An electric part test system as claimed in claim 4, wherein each of said slave processors is connected to respective common bus, to which a plurality of said local processors are connected;
   said local processors have local memories to which respective memory spaces on said bus are assigned; and
   said memory spaces of a plurality of said local memories are continuous on said bus.

6. An electric part test system as claimed in claim 5, when said electric part test system is initialized, wherein
   each of said local processors has a means for notifying said slave processor of completion of initializing when each of said local processors initializes said local memory; and
   said slave processor generates an interrupt signal when said slave processor is notified of said completion of initializing from all of said local processors that are connected to said slave processor by said bus.

7. An electric part test system as claimed in claim 6, wherein said host computer reads status information which shows a status at time of completing initialization when all of said slave processors generate said interrupt signals.

8. An electric part test system as claimed in claim 4, when said local processors provided to said slave processors complete predetermined jobs respectively, wherein each of said slave processors notifies said host computer of job completion.

9. An electric part test system as claimed in claim 8, wherein said host computer reads contents of responses based on said predetermined jobs, that are done by said local processors when all of said slave processors generate said interrupt signals.

10. An electric part test system as claimed in claim 3, when said host computer sends a command to said local processors, wherein
    said host computer writes said command to said common memories; and
    said slave processors transfer said command from said common memories to said local processors.

11. An electric part test system as claimed in claim 1, wherein said notifying unit has an AND gate, to which said interrupt signals generated by said slave processors are input, said notifying unit notifies said host computer based on an output of said AND gate.

12. A transmission method of transmitting a command in an electric part test system which comprises a host computer which evaluates test results of electric parts; a plurality of local processors, each of which is provided to each of said electric parts and receives each of said test results of said electric parts; a plurality of slave processors which notify said host computer of said test results which are received by said local processors; and common memories which said slave processors may write data to and said host computer may read said data from; comprising:

a step in which said host computer writes said command to said common memories; and a step in which said slave processors transfer said command from said common memories to said local processors.

13. A transmission method of transmitting test results of electric parts in an electric part test system which comprises a host computer which evaluates said test results; a plurality of local processors, each of which is provided to each of said electric parts and receives each of said test results of said electric parts; a plurality of slave processors, each of which is connected to said local processors by a common bus; and common memories which said slave processors may write data to and said host computer may read said data from; comprising:

a step in which each of said slave processors judges whether said local processors that are connected to each of said slave processors receive said test results;

a step in which said slave processors write said test results received by said local processors to said common memories;

a step in which said slave processors generate interrupt signals to said host computer; and a step in which said test results written to said common memories are transmitted to said host computer in a case where all of said slave processors generate said interrupt signals.

* * * * *